(12) United States Patent
Godau et al.

(10) Patent No.: US 6,407,554 B1
(45) Date of Patent: Jun. 18, 2002

(54) DIAGNOSTIC TESTER FOR ELECTRONIC CONTROL DEVICES IN A VARIETY OF MOTOR VEHICLE TYPES

(75) Inventors: Ralf Godau, Puchheim; Michael Rowedder, Munich, both of (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 0 days.

(21) Appl. No.: 09/119,747

(22) Filed: Jul. 21, 1998

(30) Foreign Application Priority Data

Jul. 21, 1997 (DE) .......................... 197 31 283

(51) Int. Cl.⁷ .......................... G01R 31/00; G06F 7/00
(52) U.S. Cl. .......................... 324/503; 701/33
(58) Field of Search .......................... 324/503, 402, 324/379, 556; 701/33

(56) References Cited

U.S. PATENT DOCUMENTS

| | | |
|---|---|---|
| 3,935,427 A | 1/1976 | Geul |
| 5,442,170 A | 8/1995 | Kreft et al. |
| 5,530,360 A * | 6/1996 | Kerchaert et al. .......... 324/503 |
| 5,555,498 A | 9/1996 | Berra et al. |

FOREIGN PATENT DOCUMENTS

| | | |
|---|---|---|
| DE | 29 18 956 | 11/1980 |
| DE | 35 40 599 | 5/1987 |
| DE | 37 27 549 | 2/1988 |
| DE | 38 06 794 | 9/1988 |
| DE | 43 00 112 | 7/1993 |
| DE | 195 41 816 | 5/1996 |
| EP | 0 709 755 | 5/1996 |
| WO | WO 89/06839 | 7/1989 |
| WO | WO 95/32534 | 11/1995 |

* cited by examiner

Primary Examiner—N. Le
Assistant Examiner—James C Kerveros
(74) Attorney, Agent, or Firm—Crowell & Moring LLP

(57) ABSTRACT

In a diagnostic tester for electronic control devices in a variety of different motor vehicles, a universal plug connection is provided that is identical for the various types of motor vehicles. The tester can be connected through the plug connection to a diagnostic plug connection in each motor vehicle that is linked with the control devices to be diagnosed. The connection is standardized mechanically with a fixed number of plug contacts but not in terms of the signal assignments of the plug contacts and the electrical properties of the signals to be transmitted. The universal plug connection is mechanically adapted to the standardized diagnostic plug connection. In addition, an adapter unit is connected to the diagnostic device side of the universal plug connection. The adapter unit automatically creates the necessary electrical connections between the plug contacts of the universal plug connection and a CPU of the diagnostic tester in accordance with the signal assignments of the plug contacts associated with each type of motor vehicle.

9 Claims, 1 Drawing Sheet

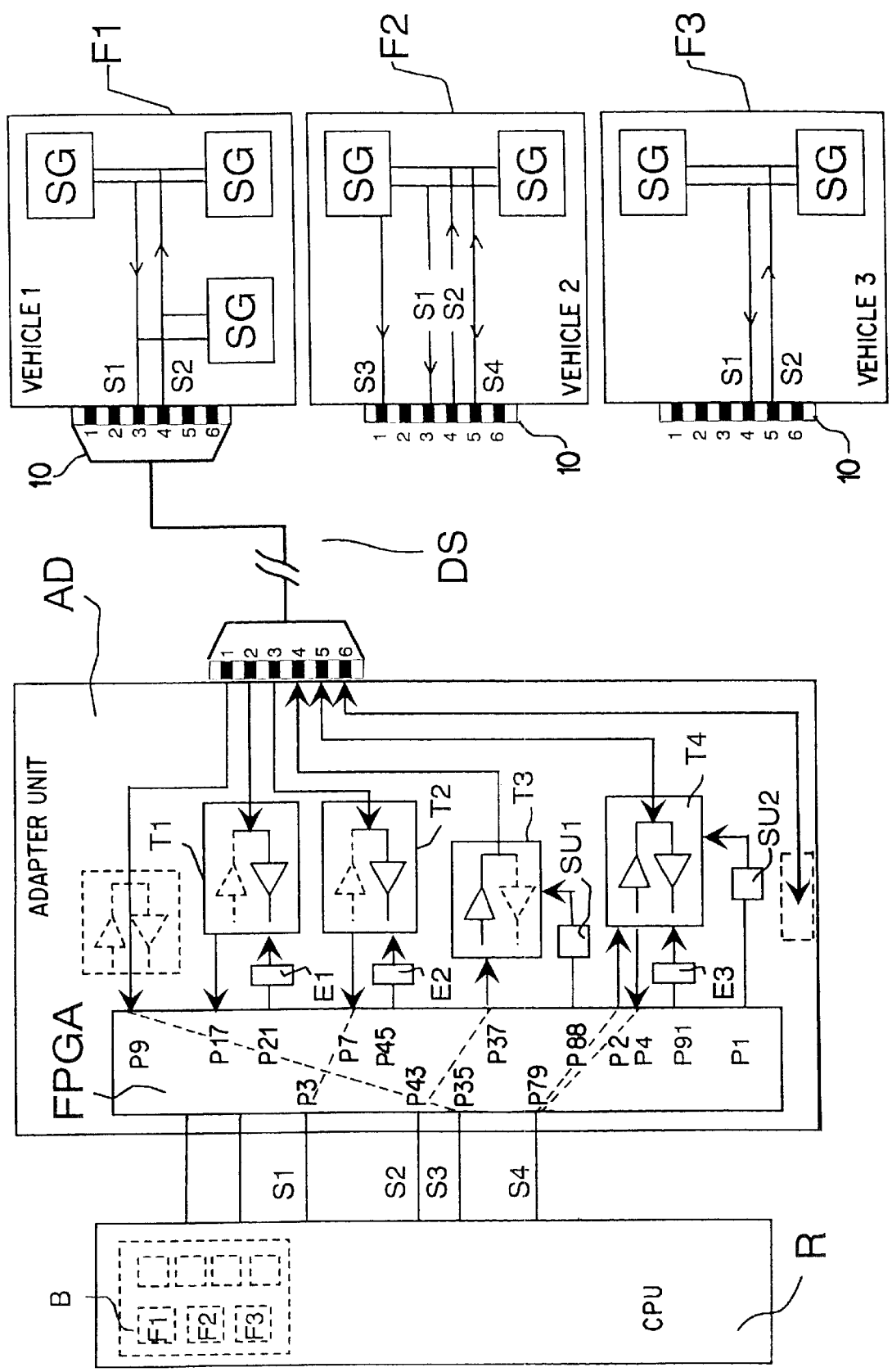

DIAGNOSTIC TESTER FOR ELECTRONIC CONTROL DEVICES IN A VARIETY OF MOTOR VEHICLE TYPES

BACKGROUND AND SUMMARY OF THE INVENTION

This application claims the priority of German Patent Application No. 197 31 283.7, filed Jul. 21, 1997, the disclosure of which is expressly incorporated by reference herein.

The invention relates to a diagnostic tester for electronic control devices in various types of motor vehicles and, more particularly, to a diagnostic tester which can be connected by a plug connection in any motor vehicle to a diagnostic plug connection connected with the control devices to be diagnosed. The connection is standardized mechanically with a predetermined number of plug contacts but not, however, in terms of the signal assignments of the plug contacts and the electrical properties of the signals to be transmitted.

Modern motor vehicles have a permanently installed diagnostic plug connection for connecting a diagnostic tester. The connection is connected on the side of the motor vehicle with the control devices to be diagnosed. The diagnostic plug connections in the various vehicle types are identical mechanically, especially as regards the specified number of plug contacts and as regards the shape of the diagnostic plug connection, on the basis of international standards for so-called on-board diagnostic systems for motor vehicles.

Many motor vehicle manufacturers currently make conventional use of the 16-pole PBD II plug according to SAE standard SAE-J-1962 as the diagnostic plug connection. This diagnostic plug connection is partially not standardized in terms of the way that the signal is applied to the plug contacts and in terms of the electrical properties of the signals to be transmitted. For example, electrical fault diagnosis signals can be applied through the conventional diagnostic bus leads in various vehicle types to different plug contacts of the diagnostic plug connection. In addition, the electrical properties of the signals to be transmitted, especially as a result of internal resistances, input switching thresholds, or output levels that differ in the vehicle, vary from vehicle to vehicle. This problem has been solved in the past by supplying a plurality of different kinds of adapter cables as plug connections between the motor vehicle and the diagnostic device for use with the diagnostic tester. The cables create the necessary electrical connections and adjustments in each case to the electrical properties for the various vehicle types. This solution is especially disadvantageous with respect to cost, logistics, and the probability of incorrect operation by confusing the adapter cables.

Hence, the goal of the present invention is to improve upon the diagnostic testers of the above-mentioned type such that the above disadvantages are eliminated.

This goal is achieved by a diagnostic tester for electronic control devices which can be connected by a plug connection in any motor vehicle to a diagnostic plug connection connected with the control devices to be diagnosed. The connection is standardized mechanically with a predetermined number of plug contacts but not, however, in terms of the signal assignments of the plug contacts and the electrical properties of the signals to be transmitted The plug connection is a universal plug connection that is identical for the various types of motor vehicles. The connection is mechanically adapted to the standardized diagnostic plug connection. An adapter unit is connected at the diagnostic tester side of the universal plug connection. The adapter unit automatically creates the necessary electrical connections between the plug contacts of the universal plug connection and the central processing unit CPU of the diagnostic device in accordance with the signal assignments of the plug contacts made for each type of motor vehicle. Advantageous improvements of the invention are also described herein.

The plurality of adapter cables is replaced in the diagnostic tester according to the present invention by a single universal plug connection for all types of motor vehicles. The function of the plurality of adapter cables is assumed by a signal adapter unit which automatically produces the necessary electrical connections and adjustments to the electrical properties of the signals to be transmitted. Advantageously, the signal adapter unit has for this purpose a module that can be reprogrammed in terms of its function and/or its pin assignments, said module being known for example as a so-called FPGA (field programmable gate arrays) module made by the Xilinx company. Since this module is basically unsuitable for processing motor vehicle signals, especially those at a high level, this module operates with drivers in the form of universal transmitter and/or receiver units. Preferably, a driver is assigned to each plug contact of the universal plug connection. The drivers can operate, for example, as receivers, transmitters, or as transmitters and receivers for bidirectional signals.

The operation of the driver can be configured by means of the reprogrammable module. Similarly, the electrical properties of the signals to be transmitted are preferably adapted by suitable configuration of the drivers by means of the reprogrammable module. Because the module can be reprogrammed in terms of its function and assignments, for example, similar signals in its information content that are assigned to certain inputs or outputs of the diagnostic tester or of its CPU can be applied to these inputs or outputs, even if these signals are being transmitted over different plug contacts of the diagnostic plug connection :and with different electrical properties (differences in signal level for example).

Preferably, the adapter unit, as the result of the application of certain input signals, recognizes which type of vehicle is to be diagnosed at the moment and then adapts automatically to the corresponding signal assignments of the plug contacts and to the electrical properties of the signals to be transmitted. Input signals of this kind for detecting a specific type of motor vehicle can, for example, be produced manually for example by operating a switch on the diagnostic tester or by means of a signal, transmitted through a specific plug contact from the motor vehicle, that is capable of distinguishing the types of motor vehicles.

A considerable cost savings is achieved with the diagnostic tester according too the present invention since the additional adapter contributes only insignificantly to the total price of the diagnostic tester, while the plurality of adapter cables can be eliminated. Ion addition, the operation of the diagnostic tester is simplified and the possibility of improper operation is eliminated by using a single universal plug connection and a partially fully automatic adapter.

Other objects, advantages and novel features of the present invention will become apparent from the following detailed description of the invention when considered in conjunction with the accompanying drawings.

BRIEF DESCRIPTION OF THE DRAWING

The drawing shows an embodiment of the present invention, illustrating the cooperation of different motor vehicle types with a universal adapter unit of a diagnostic tester according to the invention.

DETAILED DESCRIPTION OF THE DRAWING

The drawing shows three different types of motor vehicles F1 to F3 which also differ in terms of the arrangement and number of electronic control devices SG contained therein. The lie electronic control devices SG are connected with one another by a data bus, for example. Individual signals S1 to S4 which are the input and/or output signals of a specific control device SG are connected with a diagnostic plug connection 10 that has plug contacts 1 to 6 and is mechanically identical for motor vehicle types F1 to F3.

Signals S1 and S2 for example are the electrical signals transmitted by two diagnostic leads like those defined in accordance with the international standards for on-board diagnosis. Signal S3 for example represents the battery voltage as an analog signal and signal S4 is a digital bidirectional signal for example.

The diagnostic tester consists of a central processing unit (CPU) R and an adapter unit AD. Signals S1 and S3 are each assigned one input on the CPU R. Similarly, the bidirectional signal S4 has an input/output and signals S2 has an output on CPU R.

In vehicle type F1, signals S1 and S2 are applied to plug contacts 3 and 4 of the diagnostic plug connection 10. These same signals S1 and S2 in vehicle type F3 on the other hand are applied to plug contacts 4 and 5 of the diagnostic plug connection. Signals S3 and S4 of vehicle type F2 are applied to plug contacts 1 and 5. There is therefore a problem of different signal assignments for the plug contacts, especially as regards vehicle types F1 and F3 and signals S1 and S2. The goal of the adapter is to create the necessary electrical connections between plug contacts 3 and 4 of vehicle type F1 and/or between plug contacts 4 and 5 of vehicle type F3 and the terminals on CPU R that are assigned to signals S1 and S2. A single universal plug connection DS that. is identical for all types of motor vehicles is used as the plug connection between the various motor vehicle types F1 to F3 and the adapter unit AD of the diagnostic tester. The number of plug contacts 1 to 6 on the motor vehicle is equal to the number of plug contacts 1 to 6 in the adapter unit and/or diagnostic tester. Plug contacts 1 to 6 are through-connected in a 1:1 manner.

The adapter unit AD has a module FPGA whose function and pin assignments can be reprogrammed (programmable), as well as six drivers T1 to T4 (and two drivers that are not named), in the form of universal transmitter and/or receiver units. One driver is assigned to each plug contact 1 to 6 of the universal plug connection DS. The configuration of a driver, for example as a transmitter unit, as a receiver unit, or as a transmitter and receiver unit is performed in variable fashion by FPGA module depending on the signals applied to individual plug contacts 1 to 6 as a function of the type of motor vehicle in question.

For example, signal S1 of vehicle type F1 is transmitted through plug contact 3 to driver T2 of adapter unit AD. If vehicle type F1 is to be diagnosed, driver T2 is configured by module FPGA as a receiver unit. Signal S1 is read in at pin P7 of FPGA and output to CPU R via pin P3 (see the dashed-line connection). For example, when the motor vehicle type is F1, signal S2 is output by CPU R to pin P43 of module FPGA, module FPGA conducts signal S2 to plug contact 4 of universal plug connection DS via pin P37 (see the dashed-line connection) and driver T3 that is configured as a transmitter unit for vehicle type F1.

When the type of vehicle in question is F2, signal S3 is conducted through plug contact 1 to adapter unit AD. Since signal S3 represents an analog battery voltage, the driver assigned to plug contact 1 is switched off or bypassed since a driver is required only for converting digital signals. The driver associated with plug contact 1 is therefore configured for vehicle type F2 in such fashion that it functions only as a conducting lead for, signal S3 to pin P9 of module FPGA. Signal S3 is conducted from module FPGA through pin P35 to CPU R (see dashed-line connection).

The bidirectional signal S4 applied to plug contact 5, when vehicle type F2 is present, is processed by driver T4 of adapter unit AD. Therefore, if a type F2 vehicle is to be diagnosed, driver T4 is configured by module FPGA as a transmitting and receiving unit. The part of signal S4 that is to be transmitted from the diagnostic device to the vehicle is transmitted by CPU R via pin P79 and pin P2 through driver T4 to plug contact 5 of universal plug connection DS. The part of signal S4 to be transmitted by the vehicle to the diagnostic device is likewise transmitted through driver T4 as well as pins P4 and P79 of module FPGA to CPU R.

For example, if vehicle type F3 is to be diagnosed, in contrast to vehicle types F1 and F2, signal S1 must be transmitted through plug contact 4 from the vehicle to the diagnostic device. When adapter unit AD is informed that a type F3 vehicle is present, the driver T3 associated with plug contact 4, shown in the drawing as a transmitter unit, is reconfigured as a receiver unit. Similarly, when a type F3 vehicle is present, the driver T4 associated with the plug contact is reconfigured as a transmitter unit for signal S2.

Since the configuration of the drivers associated with plug contacts 1 to 6 of the universal plug connection DS takes place as a function of the type of vehicle F1 to F3 that is present at the moment, the adapter unit AD, especially module FPGA, receives information about the type of vehicle present at the moment. For this purpose, the FPGA module for example receives an input signal of its own that is generated by manual operation of a control panel F on CPU R. Module FPGA however, even at the beginning of operation of the diagnostic tester, can automatically detect from the application of the type of signals to plug contacts 1 to 6 of the universal plug connection, which type of vehicle F1 to F3 is connected at the moment.

However, adapter unit AD can also adapt the electrical properties of the signals to be transmitted. For example, signals S1 of vehicle types F1 and F2, although they are carried on the same plug contact S3 of universal plug connection VS, could also be similar in terms of their information content but differ in their output levels. For example, signal S1 of vehicle type F1 could change between 0 V and 12 V while signal S1 of vehicle type F2 could change between 0 V and 5 V. In this case, the driver associated with plug contact 3 can adjust the levels, which in this case are an electrical property of the signal S1 to be transmitted, by means of a voltage switch E2 for example. For example, drivers T1 and T4 likewise have voltage switches E1 and E3 associated with them which can be used for level adjustment if needed. In the present embodiment, only drivers T1, T2, and T4 have such voltage switches E1, E2, and E3, since, for example, it is only possible at this time to have plug contacts 2, 3, and 5 associated with these drivers for all the various types of motor vehicles for which level adjustment would be necessary.

The electrical properties of the signals to be transmitted for example also include input switching thresholds. Switching thresholds for defining a high or low level can be defined differently for example for input signal S2 in vehicle types F1 to F3. To adjust such input thresholds, threshold switches SU1 and SU2 can cooperate with drivers T3 and T4 for example. Threshold switches however are also required only for those drivers assigned to the plug contacts of the universal plug connection over which signals are transmitted to the vehicle and which are defined for the various input switching thresholds.

In addition, various internal resistances (pull-up, pull-down) can be taken into account at the inputs or outputs of control devices SG as electrical properties and/or as values that influence the electrical property of the signals to be transmitted, by means of the drivers and the FPGA module. Different internal resistances, different input switching thresholds, and different output levels however are only examples of various possible electrical properties of the signals to be transmitted.

It is important for the invention, relative to the embodiment, to be able to supply the terminals of the diagnostic tester and/or of central CPU R associated with the specific signals, in this case signals S1 to S4, independently of the assignment of these signals S1 to S4 on the vehicle side to plug contacts 1 to 6 of universal plug connection DS, i.e. to supply the corresponding signals S1 to S4 independently of the signal assignments of the plug contacts. The electrical connections required for this purpose are made by adapter unit AD, especially by the FPGA module which can be reprogrammed in terms of its function and/or pin assignments. While the FPGA module is essentially responsible for the logic as regards the various signal assignments of the plug contacts, the configurable drivers eliminate problems that result from different electrical properties of the signals to be transmitted from the control devices associated with various types of vehicles. It should also be pointed out that the threshold switches SU1 and SU2, the voltage switches E1 to E3, and possibly other structural elements that influence electrical properties can also be integrated into the drivers, and can at least form a functional unit with the drivers.

It should also be pointed out that for suitable configuration of the drivers, the latter must have suitable electrical equipment. However, not all of the drivers need to be equipped in the same way. For example, if a driver is required as a transmitter unit by all of the types of vehicles in question, no equipment is necessary that would make it possible for it to be a receiver unit as well.

It is clear from the embodiment that a single universal plug connection according to the invention can be used for all types of motor vehicles. In addition, the automatic adapter unit AD significantly increases the user-friendliness of a diagnostic tester.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

What is claimed is:

1. A diagnostic tester for electronic control devices in various types of motor vehicles each of said various types of motor vehicles having a different requirement for diagnostic testing than others of said various types of motor vehicles wherein said tester is connectable via a plug connection in a motor vehicle to a diagnostic plug connection coupled with the electronic control devices to be diagnosed, the plug connection being standardized mechanically and having a predetermined number of plug contacts but not being standardized in terms of signal assignments of the plug contacts and electrical properties of signals to be transmitted over the plug contacts, wherein the plug connection is a universal plug connection identical for the various types of motor vehicles, said universal plug connection being mechanically adapted to the standardized diagnostic plug connection, said tester comprising:

an adapter unit coupled at a diagnostic tester side of the universal plug connection; and a central processing unit;

said adapter unit automatically creating correct electrical connections between the plug contacts of the universal plug connection and ports of the central processing unit in accordance with signal assignments of the plug contacts that are made for each of said types of motor vehicle.

2. The diagnostic tester according to claim 1, wherein the electrical properties of the signals to be transmitted between the CPU and the universal plug connection are switchable as a function of the type of motor vehicle via the adapter unit.

3. The diagnostic tester according to claim 1, wherein the adapter unit comprises:

a programmable module capable of being reprogrammed with respect to functions and/or pin assignments thereof; and a plurality of drivers, one of which is associated with each of the plug contacts, said drivers being universal transmitter and/or receiver units and being connectable on one hand directly to the universal plug connection and on the other hand via the programmable module in order to produce the correct electrical connections corresponding to the signal assignments of the plug contacts for each type of vehicle, said drivers also being configurable for switching the electrical properties of the signals to be transmitted.

4. The diagnostic tester according to claim 2, wherein the adapter unit comprises:

a programmable module capable of being reprogrammed with respect to functions and/or pin assignments thereof; and a plurality of drivers, one of which is associated with each of the plug contacts, said drivers being universal transmitter and/or receiver units and being connectable on one hand directly to the universal plug connection and on the other hand via the programmable module in order to produce the correct electrical connections corresponding to the signal assignments of the plug contacts for each type of vehicle, said drivers also being configurable for switching the electrical properties of the signals to be transmitted.

5. A diagnostic tester interface for interfacing between different types of motor vehicles having a mechanically standard plug connection and a central Processing unit having input/output ports, each of said different types of motor vehicles having a different requirement for diagnostic testing than others of said different types of motor vehicles, the interface comprising:

an adapter unit universally coupling at one side to the mechanically standardized plug connection in the different types of motor vehicles :and, on the other side, to the input/output ports of the central processing unit;

wherein said adapter unit automatically configures correct electrical connections between plug contacts of the mechanically standardized plug connection and the input/output ports of the central processing unit in accordance with signal assignments of the plug contacts defined for each different type of motor vehicle.

6. The interface according to claim 5, wherein electrical properties of signals transmittable between the central processor unit and the standardized plug connection are switched via the adapter unit as a function of the type of motor vehicle.

7. The interface according to claim 5, wherein the adapter unit further comprises:

a programmable logic array having ports coupled with the input/output ports of the central processing unit; and a plurality of drivers coupled between other ports of the programmable logic array and the plug contacts of the standard plug connection, one of said plurality of drivers being coupled with one of the plug contacts in order to function as a universal transmitter and/or receiver unit.

8. The interface according to claim 7, wherein said plurality of drivers are configured to produce the correct electrical connections corresponding to the signal assignments of the plug contacts for each of the different types of vehicles and/or for switching electrical properties of the signals to be transmitted for each of the different types of vehicles.

9. A method for coupling a diagnostic tester with different types of motor vehicles having electronic control devices to be diagnosed each of said different types of motor vehicles having a different requirement for diagnostic testing than others of said different types of motor vehicles, the method comprising the acts of:

providing an adapter unit coupled at one end to a central processing unit and at the other end to a diagnostic plug connector by using a universal plug connection which is mechanically standardized in the different types of motor vehicles with respect to the arrangement of plug contacts thereof;

determining the type of motor vehicle plugged into the adapter unit; and automatically configuring a programmable logic array of the adapter unit to establish correct electrical connections of the signal assignments provided over the plug contacts by the motor vehicle with the ports of the central processing unit.

\* \* \* \* \*